United States Patent
Ahn et al.

(10) Patent No.: US 9,099,680 B2
(45) Date of Patent: Aug. 4, 2015

(54) DISPLAY DEVICE AND METHOD OF MANUFACTURING THE SAME

(71) Applicant: Samsung Display Co. Ltd., Yongin, Gyeonggi-Do (KR)

(72) Inventors: Ki Wan Ahn, Yangcheon-gu (KR); Joung Keun Park, Asan-si (KR); Hee Jun Yoo, Yongin-si (KR); Joo Sun Yoon, Songpa-gu (KR); Yong Jae Jang, Mapo-gu (KR); Jae Hyuk Jang, Seongnam-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/089,486

(22) Filed: Nov. 25, 2013

(65) Prior Publication Data

US 2015/0041765 A1   Feb. 12, 2015

(30) Foreign Application Priority Data

Aug. 7, 2013 (KR) .................. 10-2013-0093763

(51) Int. Cl.
*H01L 51/52* (2006.01)
*H01L 51/56* (2006.01)

(52) U.S. Cl.
CPC ........ *H01L 51/5268* (2013.01); *H01L 51/5271* (2013.01); *H01L 51/56* (2013.01)

(58) Field of Classification Search
CPC .. H01L 51/00; H01L 51/5268; H01L 51/5271
USPC .............................................. 438/28; 313/500
See application file for complete search history.

(56) References Cited

U.S. PATENT DOCUMENTS

2009/0051284 A1*   2/2009   Cok et al. ................. 313/506
2013/0285540 A1* 10/2013   Jo et al. .................... 313/504

FOREIGN PATENT DOCUMENTS

| JP | 2004-349064 A | 12/2004 |
|---|---|---|
| KR | 10-2012-0002123 A | 1/2012 |
| KR | 10-2012-0062374 A | 6/2012 |
| KR | 10-2013-0016937 A | 2/2013 |

* cited by examiner

*Primary Examiner* — Caridad Everhart
(74) *Attorney, Agent, or Firm* — Robert E. Bushnell, Esq.

(57) ABSTRACT

A display device and method of manufacturing the same, the display device having a substrate, a plurality of scattering patterns which are located on the substrate and comprise crystallized metal oxide, a first electrode which is located on the scattering patterns, an organic light-emitting layer which is located on the first electrode, and a second electrode which is located on the organic light-emitting layer.

20 Claims, 17 Drawing Sheets

DISPLAY DEVICE AND METHOD OF MANUFACTURING THE SAME

This application makes reference to, incorporates the same herein, and claims all benefits accruing under 35 U.S.C §119 from an application earlier filed in the Korean Intellectual Property Office on 7 Aug. 2013 and there duly assigned Serial No. 10-2013-0093763.

BACKGROUND OF THE INVENTION

1. Field of the Invention

The present invention relates to a display device and a method of manufacturing the same.

2. Description of the Related Art

Display devices are devices that visually display data. Examples of the display devices include liquid crystal displays, electrophoretic displays, organic light-emitting displays, inorganic electroluminescent displays, field emission displays, surface-conduction electron-emitter displays, plasma displays, and cathode ray displays.

Of the above display devices, organic light-emitting displays have superior viewing angles and contrast ratios because they are self-luminous, can be made light and thin because they do not require backlight, and are advantageous in terms of power consumption. In addition, the organic light-emitting displays can be driven at direct current (DC) low voltages, have fast response speed, and are advantageous particularly in terms of manufacturing costs. Generally, an organic light-emitting display has a structure in which an anode, an organic layer and a cathode are sequentially stacked on a substrate on which a pixel circuit such as a thin-film transistor is formed.

The emission structure of such an organic light-emitting display may be divided into a resonance structure and a non-resonance structure according to whether light is resonated. In the resonance structure, light emitted from an organic layer exits the organic light-emitting display after being resonated within the organic light-emitting display. In the non-resonance structure, light emitted from the organic layer exits the organic light-emitting display without being resonated within the organic light-emitting display.

An organic light-emitting display having the resonance structure needs to satisfy different resonance conditions individually for different colors. For example, in the organic light-emitting display having the resonance structure, organic layers respectively emitting red light, green light and blue light should have different thicknesses. In the organic light-emitting display having the resonance structure, each organic layer should be deposited using an independent mask. This complicates the process and increases manufacturing costs.

Unlike the organic light-emitting display having the resonance structure, an organic light-emitting display having the non-resonance structure can be manufactured in a simple process and at a low cost.

The organic light-emitting display having the non-resonance structure may include a scattering structure. The scattering structure scatters light emitted from an organic layer, thereby preventing the occurrence of resonance within the organic light-emitting display.

The scattering structure may be formed using agglomeration properties of silver (Ag). In an example, the scattering structure may be formed using silver crystal particles formed by high-temperature heat treatment as a scattering lens. In another example, the scattering structure may be formed by sequentially depositing tungsten oxide and silver and then patterning the tungsten oxide using silver crystal particles formed by high-temperature heat treatment as an etch mask.

However, it is difficult to control the size and density of silver crystal particles formed by agglomeration of silver. In addition, due to low chemical resistance of the silver, it is difficult to perform a process in a state where the silver is exposed. Further, since it is difficult to develop an etchant that can selectively etch the tungsten oxide, it is difficult to pattern the tungsten oxide as desired.

SUMMARY OF THE INVENTION

Aspects of the present invention provide a display device having a non-resonance structure which includes scattering patterns formed of crystallized metal oxide.

Aspects of the present invention also provide a method of manufacturing a display device having a non-resonance structure which includes scattering patterns formed of crystallized metal oxide.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a display device comprising a substrate, a plurality of scattering patterns which are located on the substrate and comprise crystallized metal oxide, a first electrode disposed above the scattering patterns, an organic light-emitting layer disposed on the first electrode, and a second electrode disposed on the organic light-emitting layer.

The scattering patterns may comprise at least one of tin oxide, indium oxide, zinc oxide, titanium oxide, antimony oxide, indium-tin oxide, zinc-tin oxide, antimony-tin oxide, and indium-zinc oxide.

The scattering patterns may be formed of the same material as the first electrode or the second electrode.

The crystallinity of the scattering patterns may increase toward the substrate.

The scattering patterns may be arranged randomly, and each of the scattering patterns may have a convex shape.

The display device may further comprise an insulating layer interposed between the scattering patterns and the first electrode, a refractive index of the insulating layer may be greater than a refractive index of the scattering patterns.

The display device may further comprise a reflective layer interposed between the substrate and the scattering patterns, the scattering patterns may directly contact the reflective layer.

According to another aspect of the present invention, there is provided a method of manufacturing a display device, the method comprising forming a substrate, forming a plurality of scattering patterns, which comprise crystallized metal oxide, in an emission region of the substrate, and forming a first electrode on the scattering patterns.

The forming of the scattering patterns may comprise depositing amorphous metal oxide on the substrate, and crystallizing portions of the deposited amorphous metal oxide.

The crystallizing of the portions of the deposited amorphous metal oxide may be performed at room temperature.

The forming of the scattering patterns may comprise depositing a second amorphous metal oxide at the same time as crystallizing the portions of the deposited first amorphous metal oxide.

The method of manufacturing a display device may further comprise removing uncrystallized portions of the first and second amorphous metal oxides after the forming of the scattering patterns.

The method of manufacturing a display device may further comprise forming an insulating layer, having a greater refractive index than a refractive index of the scattering patterns, on the scattering patterns after the removal of the uncrystallized portions of the first and second amorphous metal oxides.

The amorphous metal oxide may be amorphous indium-tin oxide.

The forming of the scattering patterns may comprise adjusting a particle size of the scattering patterns by adjusting at least one of a thickness to which the first or second amorphous metal oxide is deposited and a number of layers of amorphous metal oxide being deposited.

The forming of the scattering patterns may comprise discharging at least one of hydrogen and water onto the substrate at the same time as depositing the first or second amorphous metal oxide.

The forming of the scattering patterns may comprise adjusting a particle size of the scattering patterns by adjusting a rate of discharge of at least one of the hydrogen and the water.

The forming of the scattering patterns may comprise depositing the first amorphous metal oxide while discharging at least one of the hydrogen and the water at a first rate, and depositing the second amorphous metal oxide while discharging at least one of the hydrogen and the water at a second rate greater than the first rate.

According to still another aspect of the present invention, there is provided a method of manufacturing a display device, the method comprising depositing amorphous metal oxide on a substrate at room temperature while crystallizing a portion of the amorphous metal oxide located adjacent to the substrate, and sequentially forming a first electrode, an organic light-emitting layer, and a second electrode on the crystallized portion of the amorphous metal oxide.

The method of manufacturing a display device may further comprise, after the crystallizing of the portion of the amorphous metal oxide, removing uncrystallized portions of the amorphous metal oxide, and forming an insulating layer, which has a refractive index greater than a refractive index of the crystallized portion of the amorphous metal oxide, on the crystallized portion of the amorphous metal oxide.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
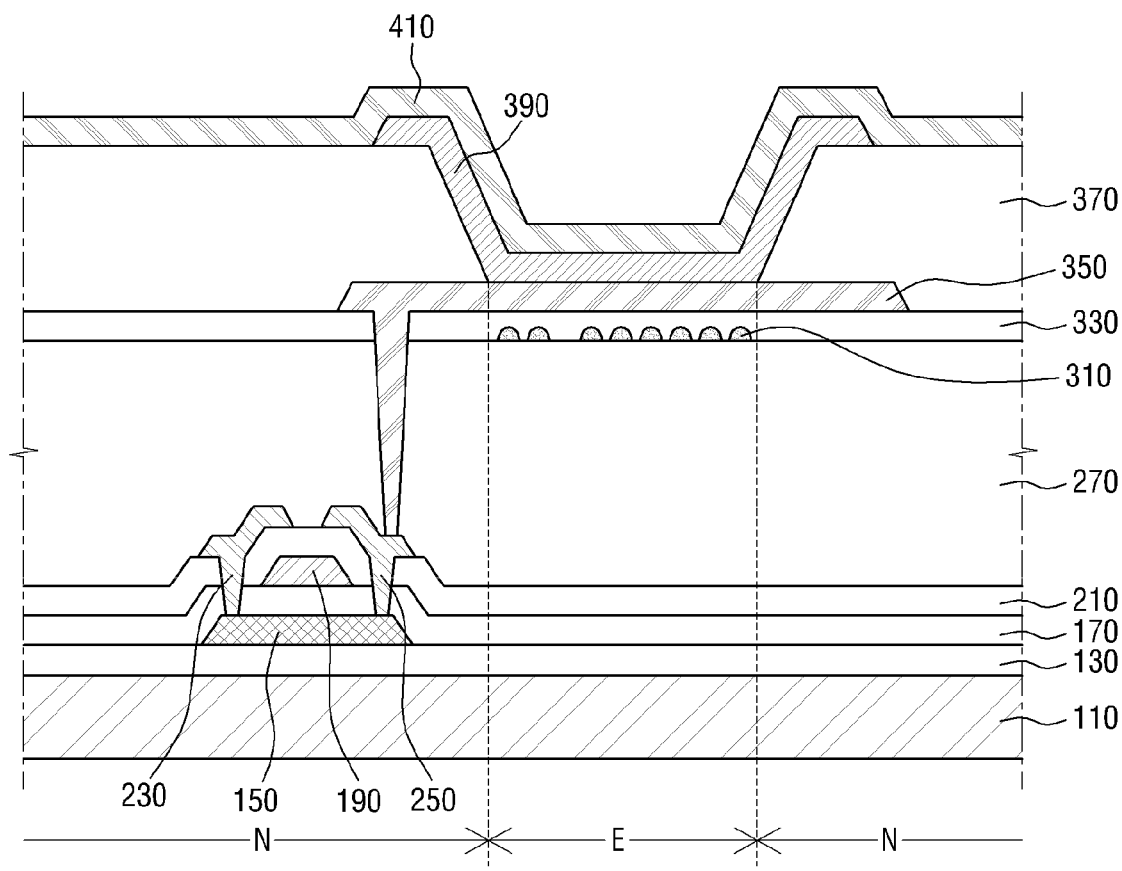
FIG. 1 is a cross-sectional view of a display device according to an embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

A display device is a device which displays an image and may be a liquid crystal display, an electrophoretic display, an organic light-emitting display, an inorganic electroluminescent display, a field emission display, a surface-conduction electron-emitter display, a plasma display, a cathode ray display, etc.

An organic light-emitting display device will hereinafter be described as an example of the display device according to the current embodiment. However, the display device according to the present invention is not limited to the organic light-emitting display, and various types of displays can be used.

Hereinafter, embodiments of the present invention will be described with reference to the attached drawings.

FIG. 1 is a cross-sectional view of a display device according to an embodiment of the present invention.

Referring to FIG. 1, the display device according to the current embodiment may include a substrate 110, a plurality of scattering patterns 310 disposed on the substrate 110, a first electrode 350 disposed on the scattering patterns 310, an organic light-emitting layer 390 disposed on the first electrode 350, and a second electrode 410 disposed on the organic light-emitting layer 390. The display device according to the current embodiment of the present invention may further include a buffer layer 130, a semiconductor pattern 150, a gate insulating layer 170, a gate electrode 190, an interlayer insulating film 210, a source electrode 230, a drain electrode 250, a planarization layer 270, a high refractive layer 330, and a pixel defining layer 370.

The substrate 110 may include an insulating substrate. The insulating substrate may be formed of a transparent glass material containing transparent SiO2 as its main component. In some embodiments, the insulating substrate may be formed of an opaque material or a plastic material. Further, the insulating substrate may be a flexible substrate that can be bent, folded, or rolled.

The substrate 110 may include an emission region E and a non-emission region N. The emission region E may be a region where light is emitted out of the display device, and the non-emission region N may be a region where light is not emitted out of the display device. In addition, the emission region E may be a region where the pixel defining layer 370 is not located, and the non-emission region N may be a region where the pixel defining layer 370 is located. Although not shown in the drawing, when viewed from above, a plurality of emission regions E may be arranged in a matrix, and the non-emission region N may surround the emission regions E.

The buffer layer 130 may be formed on the substrate 110. The buffer layer 130 may prevent the diffusion of metallic atoms, impurities, etc. from the substrate 110. In addition, if a top surface of the substrate 110 is not even, the buffer layer 130 may improve the flatness of the top surface of the substrate 110. The buffer layer 130 may be formed of a silicon compound. For example, the buffer layer 130 may include silicon oxide, silicon nitride, silicon oxynitride, silicon oxycarbide, silicon carbonitride, etc. These materials may be used alone or in combination.

The semiconductor pattern 150 may be formed on the buffer layer 130. The semiconductor pattern 150 may include a source region, a drain region, and a channel region. In addition, the semiconductor pattern 150 may be formed of amorphous silicon, polycrystalline silicon, or monocrystalline silicon. In an alternative embodiment, the semiconductor pattern 150 may be formed of an oxide semiconductor.

The gate insulating layer 170 may be formed on the buffer layer 130 to cover the semiconductor pattern 150. The gate insulating layer 170 may be formed of silicon oxide, metal oxide, etc. Examples of the metal oxide that can be used in the gate insulating layer 170 may include hafnium oxide (HfOx), aluminum oxide (AlOx), zirconium oxide (ZrOx), titanium oxide (TiOx), and tantalum oxide (TaOx). These materials may be used alone or in combination.

The gate electrode 190 may be formed on the gate insulating layer 170. The gate electrode 190 may be formed on a portion of the gate insulating layer 170 under which the semiconductor pattern 150 is located. The gate electrode 190 may include a metal, an alloy, metal nitride, conductive metal oxide, a transparent conductive material, etc. In an example, the gate electrode 190 may include aluminum (Al), an aluminum-containing alloy, aluminum nitride (AlNx), silver (Ag), a silver-containing alloy, tungsten (W), tungsten nitride (WNx), copper (Cu), a copper-containing alloy, nickel (Ni), chrome (Cr), chrome nitride (CrOx), molybdenum (Mo), a molybdenum-containing alloy, titanium (Ti), titanium nitride (TiNx), platinum (Pt), tantalum (Ta), tantalum nitride (TaNx), neodymium (Nd), scandium (Sc), strontium ruthenium oxide (SrRuxOy), zinc oxide (ZnOx), indium tin oxide (ITO), tin oxide (SnOx), indium oxide (InOx), gallium oxide (GaOx), indium zinc oxide (IZO), etc. These materials may be used alone or in combination.

The interlayer insulating film 210 may be formed on the gate insulating layer 170 and will cover the gate electrode 190. The interlayer insulating film 210 may be formed of a silicon compound. For example, the interlayer insulating film 210 may include silicon oxide, silicon nitride, silicon oxynitride, silicon oxycarbide, silicon carbonitride, etc. These materials may be used alone or in combination.

The source electrode 230 and the drain electrode 250 may be formed on the interlayer insulating film 210. The source electrode 230 and the drain electrode 250 may be separated by a predetermined distance with respect to the gate electrode 190 and may be disposed adjacent to the gate electrode 190. For example, the source electrode 230 and the drain electrode 250 may penetrate through the interlayer insulating film 210 and the gate insulating film 170 so as to contact the source region and the drain region of the semiconductor pattern 150, respectively. Each of the source electrode 230 and the drain electrode 250 may include a metal, an alloy, metal nitride, conductive metal oxide, a transparent conductive material, etc. In an example, each of the source electrode 230 and the drain electrode 250 may include aluminum, an aluminum-containing alloy, aluminum nitride, silver, a solver-containing alloy, tungsten, tungsten nitride, copper, a copper-containing alloy, nickel, chrome, chrome nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in combination. The formation of the source electrode 230 and the drain electrode 250 on the interlayer insulating film 210 may produce a thin-film transistor (TFT), which includes the semiconductor pattern 150, the gate insulating layer 170, the gate electrode 190, the source electrode 230 and the drain electrode 250, on the substrate 110 as a switching element of the organic light-emitting display.

The planarization layer 270 may be formed on the interlayer insulating film 210 and will cover the source electrode 230 and the drain electrode 250. The planarization layer 270 may be thick enough to completely cover the source electrode 230 and the drain electrode 250. In addition, a top surface of the planarization layer 270 may be flat. The planarization layer 270 may be formed of an organic material or an inorganic material. For example, the planarization layer 270 may include an acrylic-based polymer, polyimide-based polymer, polyamide-based polymer, siloxane-based polymer, polymer containing photosensitive acryl carboxyl, novolak resin, alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in combination.

The scattering patterns 310 may be formed on the planarization layer 270. In an exemplary embodiment, the scattering patterns 310 may directly contact the planarization layer 270. In addition, the scattering patterns 310 may be interposed between the planarization layer 270 and the high refractive layer 330. The scattering patterns 310 do not overlap the TFT. The scattering patterns 310 are disposed on the emission region E. The scattering patterns 310 are not disposed in the non-emission region N.

The scattering patterns 310 may include crystallized metal oxide. When the metal oxide is crystallized, it forms a polycrystalline structure or a monocrystalline structure. In an exemplary embodiment, the scattering patterns 310 may include at least one of crystallized tin oxide, indium oxide, zinc oxide, titanium oxide, antimony oxide, indium-tin oxide, zinc-tin oxide, antimony-tin oxide, and indium-zinc oxide. However, the present invention is not limited thereto, and the scattering patterns 310 may include various types of metal oxides.

The scattering patterns 310 may be formed of the same material as the first electrode 350 or the second electrode 410. In an exemplary embodiment, if a display device according to the embodiment is a bottom emission organic light-emitting display, the scattering patterns 310 may be formed of the same material as the first electrode 350. In another exemplary embodiment, if a display device according to the embodiment is a top emission display device, the scattering patterns 310 may be formed of the same material as the second electrode 410. The scattering patterns 310 may be formed of a transparent material. However, the present invention is not limited thereto, and the scattering patterns 310 may also be formed of a semi-transparent material.

The scattering patterns 310 may be arranged randomly. That is, the scattering patterns 310 may be arranged in an amorphous manner. In an exemplary embodiment, the scattering patterns 310 may be arranged at irregular intervals.

Each of the scattering patterns 310 may have a convex shape. In other words, the scattering patterns 310 may be shaped like islands. In an exemplary embodiment, each of the scattering patterns 310 may be shaped like a convex lens. However, the present invention is not limited thereto, and each of the scattering patterns 310 may have various convex shapes. In another exemplary embodiment, each of the scattering patterns 310 may substantially be domed.

A refractive index of the scattering patterns 310 may be different from a refractive index of the planarization layer 270 and/or a refractive index of the high refractive layer 330. In an exemplary embodiment, the refractive index of the scattering patterns 310 may be greater than the refractive index of the planarization layer 270. In addition, the refractive index of the scattering patterns 310 may be smaller than the refractive index of the high refractive layer 330. Further, the refractive index of the scattering patterns 310 may be between the refractive index of the planarization layer 270 and the refractive index of the high refractive layer 330.

The scattering patterns 310 may be formed by crystallization of amorphous metal oxide. In other words, the scattering patterns 310 may be formed by agglomeration of the amorphous metal oxide. Here, the amorphous metal oxide may include at least one of, but not limited to, amorphous tin oxide, indium oxide, zinc oxide, titanium oxide, antimony oxide, indium-tin oxide, zinc-tin oxide, antimony-tin oxide, and indium-zinc oxide. In an exemplary embodiment, the amorphous metal oxide may be deposited on the planarization layer 270 in a deposition chamber at room temperature, and a portion of the deposited amorphous metal oxide may be crystallized into the scattering patterns 310. In another exemplary embodiment, at the same time as the amorphous metal oxide is deposited on the planarization layer 270 within the deposition chamber, a portion of the deposited amorphous metal oxide may be crystallized into the scattering patterns 310. Here, the portion of the amorphous metal oxide that is crystallized may be a portion of the amorphous metal oxide that is located adjacent to the planarization layer 270. That is, the portion of the amorphous metal oxide that is crystallized may be a portion of the amorphous metal oxide that is deposited first.

The scattering patterns 310 may be formed not by thermal energy for crystallizing the amorphous metal oxide but by process energy (hereinafter, referred to as deposition process energy) for depositing the amorphous metal oxide within the deposition chamber. That is, the time and place for forming the scattering patterns 310 may be substantially the same as the time and place for depositing the amorphous metal oxide. Here, the deposition process energy may refer to all energy generated within the deposition chamber in which a deposition process is being performed. For example, the deposition process energy may include energy generated when ion particles created within the deposition chamber in which a deposition process is being performed collide with inner walls of the deposition chamber, the planarization layer 270, or the deposited amorphous metal oxide.

As described above, the scattering patterns 310 are not formed rapidly by thermal energy for crystallizing the amorphous metal oxide but slowly by the deposition process energy for depositing the amorphous metal oxide. Therefore, the scattering patterns 310 may have a uniform crystalline structure.

Figure 2:
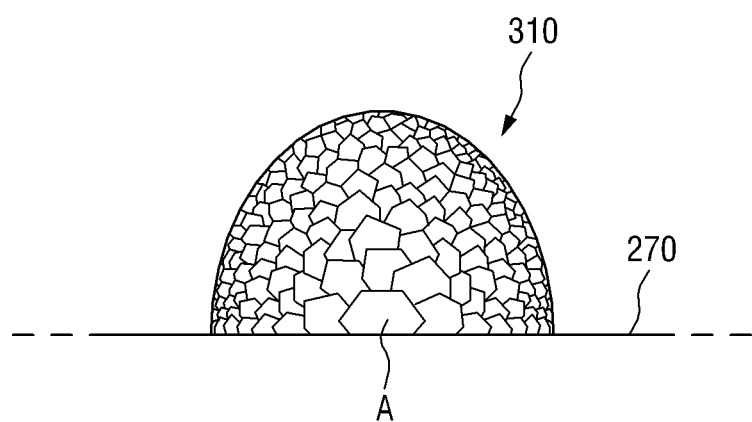
FIG. 2 is an enlarged cross-sectional view of a scattering pattern included in the display device of FIG. 1.

The crystalline structure of the scattering patterns 310 will now be described in detail with reference to FIG. 2. FIG. 2 is an enlarged cross-sectional view of one of the scattering patterns 310 included in the display device of FIG. 1.

Referring to FIG. 2, if the scattering pattern 310 has a polycrystalline structure, the crystallinity of the scattering pattern 310 may increase toward the substrate 110, that is, toward the planarization layer 270. In other words, sizes of crystals included in the scattering pattern 310 may increase toward the planarization layer 270.

This crystalline structure may result from a difference in the amount of accumulated deposition process energy. Specifically, as amorphous metal oxide is gradually deposited on the planarization layer 270, the deposition process energy may accumulate most in a portion of the amorphous metal oxide that is deposited first, that is, a portion of the amorphous metal oxide that contacts the top surface of the planarization layer 270. When the amorphous metal oxide is deposited to a certain thickness or greater, the first deposited portion of the amorphous metal oxide may be crystallized first by the sufficiently accumulated deposition process energy. Then, subsequently deposited portions of the amorphous metal oxide may be crystallized sequentially. Since the deposition process energy accumulates more in a relatively early crystallized portion of the amorphous metal oxide than in a relatively late crystallized portion of the amorphous metal oxide, the relatively early crystallized portion of the amorphous metal oxide may form relatively large crystals compared with the relatively late crystallized portion of the amorphous metal oxide.

In addition, the crystallinity of the scattering pattern 310 may increase toward a center of an interface between the scattering pattern 310 and the planarization layer 270. In other words, sizes of crystals included in the scattering pattern 310 may increase toward the center of the interface between the scattering pattern 310 and the planarization layer 270.

This crystalline structure is possible because a crystal nucleus A of the scattering pattern 310 is formed at the center of the interface between the scattering pattern 310 and the planarization layer 270. Specifically, when a portion of amorphous metal oxide that is deposited first, that is, a portion of the amorphous metal oxide that contacts the top surface of the planarization layer 270 is crystallized first, the first crystallized portion of the amorphous metal oxide may become the crystal nucleus A of the scattering pattern 310. Accordingly, the scattering pattern 310 may form a polycrystalline structure around the crystal nucleus A. Here, the deposition process energy may accumulate more in crystals relatively close to the crystal nucleus A than in crystals relatively far away from the crystal nucleus A. Therefore, the crystals relatively close to the nucleus A may be larger in size than the crystals relatively far away from the crystal nucleus A.

In summary, in a deposition process of amorphous metal oxide, the crystallinity of a portion (a relatively early deposited portion, a portion close to the top surface of the planarization layer 270, a portion close to the crystal nucleus A) of the amorphous metal oxide which receives a large amount of deposition process energy may be higher than the crystallinity of a portion (a relatively late deposited portion, that is, a portion far away from the top surface of the planarization layer 270, a portion far away from the crystal nucleus A) which receives a small amount of deposition process energy.

Referring back to FIG. 1, the high refractive layer 330 may be formed on the scattering patterns 310 and the planarization layer 270. The high refractive layer 330 may be an insulating layer formed of an insulating material. In an exemplary embodiment, the high refractive layer 330 may be formed of a silicon compound. For example, the high refractive layer 330 may include silicon oxide, silicon nitride, silicon oxynitride, silicon carbonitride, silicon oxycarbide, etc. These materials may be used alone or in combination.

The refractive index of the high refractive layer 330 may be different from the refractive index of the scattering patterns 310 and/or the refractive index of the planarization layer 270. In an exemplary embodiment, the refractive index of the high refractive layer 330 may be greater than the refractive index of the scattering patterns 310 and the refractive index of the planarization layer 270. In addition, the transparency of the high refractive layer 330 may be different from the transparency of the scattering patterns 310 and/or the transparency of the planarization layer 270. In an exemplary embodiment, the transparency of the high refractive layer 330 may be lower than the transparency of the scattering patterns 310 and the transparency of the planarization layer 270.

The first electrode 350 may be located on the high refractive layer 330. The first electrode 350 may overlap the emission region E of the substrate 110. The first electrode 350 may be inserted into a hole which penetrates through the high refractive layer 330 and the planarization layer 270, so as to be electrically connected to the drain electrode 250. The first electrode 350 may be an anode or a cathode. If the first electrode 350 is an anode, the second electrode 410 may be a cathode. Thus, embodiments of the present invention will be described below based on this assumption. However, the first electrode 350 may also be a cathode, and the second electrode 410 may be an anode.

To be used as an anode, the first electrode 350 may be formed of a conductive material with a high work function. If the organic light-emitting display is of a bottom emission type, the first electrode 350 may be formed of a material such as ITO, IZO, ZnO or In2O3 or may be formed of a stacked layer of these materials. If the organic light-emitting display is of a top emission type, the first electrode 350 may further include a reflective layer 280 formed of Ag, Mg, Al, Pt, Pd, Au, Ni, Nd, Ir, Cr, Li or Ca. The first electrode 350 can be modified in various ways to have, for example, a structure composed of two or more layers formed using two or more different materials selected from the above materials.

The pixel defining layer 370 may be formed on the first electrode 350 and the high refractive layer 330. The pixel defining layer 370 may partially expose the first electrode 350. A region exposed by the pixel defining layer 370 may become the emission region E, and a region covered by the pixel defining layer 370 may become the non-emission region N. The pixel defining layer 370 may be formed of at least one organic material selected from benzocyclobutene (BCB), polyimide (PI), polyamaide (PA), acrylic resin and phenolic resin or an inorganic material such as silicon nitride. The pixel defining layer 370 may also be formed of a photosensitizer that contains a black pigment. In this case, the pixel defining layer 370 may serve as a light blocking member.

The organic light-emitting layer 390 is formed on the first electrode 350 exposed by the pixel defining layer 370. The organic light-emitting layer 390 may overlap the emission region E of the substrate 110. Additionally organic light-emitting layer 390 may overlap a portion of the non-emission region N by being formed on a portion of the pixel defining layer 370. In response to an electric current supplied to the organic light-emitting layer 390, electrons and holes within the organic light-emitting layer 390 may recombine to form excitons, and energy from the excitons may generate light of a certain wavelength.

The organic light-emitting layer 390 may be formed of a small molecular weight organic material or a polymer organic material. The organic light-emitting layer 390 may include a hole-injection layer (HIL), a hole-transporting layer (HTL), a hole-blocking layer (HBL), an emitting layer (EML), an electron-transporting layer (ETL), an electron-injection layer (EIL), and an electron-blocking layer (EBL).

The second electrode 410 may be formed on the organic light-emitting layer 390 and the pixel defining layer 370. The second electrode 410, to be used as a cathode, may be formed of a conductive material with a low work function. In an exemplary embodiment, the second electrode 410 may be formed of Ag, Mg, Al, Pt, Pd, Au, Ni, Nd, Ir, Cr, Li or Ca. The formation of the second electrode 410 on the organic light-emitting layer 390 may produce an organic light-emitting element, which includes the first electrode 350, the organic light-emitting layer 390 and the second electrode 410, on the substrate 110 as a display element of the organic light-emitting display.

In the display device according to the current embodiment, the scattering patterns 310 scatter light emitted from the organic light-emitting layer 390. Therefore, a non-resonance structure of the display device can be easily realized. For example, if the display device of FIG. 1 is a bottom emission organic light-emitting display, light emitted from the organic light-emitting layer 390 and the light emitted from the organic light-emitting layer 390 and then reflected by the second electrode 410 may be scattered as they pass through the scattering patterns 310. Accordingly, the light emitted from the organic light-emitting layer 390 and the light emitted from the organic light-emitting layer 390 and then reflected by the second electrode 410 may exit the display device without being resonated within the display device. In addition, the high refractive layer 330 and the planarization layer 270 having different refractive indices from the refractive index of the scattering patterns 310 can further increase the light-scattering effect. Accordingly, the non-resonance structure of the display device can be better realized. Moreover, since the above light-scattering effect increases the amount of light emitted to sides of the display device, lateral visibility of the display device can be improved.

A method of manufacturing a display device according to an embodiment of the present invention will now be described with reference to FIGS. 3 through 15.

FIGS. 3 through 15 are cross-sectional views illustrating operations in a method of manufacturing the display device of FIG. 1. For simplicity, elements substantially identical to those of FIG. 1 are indicated by like reference numerals, and thus a redundant description thereof will be omitted.

Figure 3:
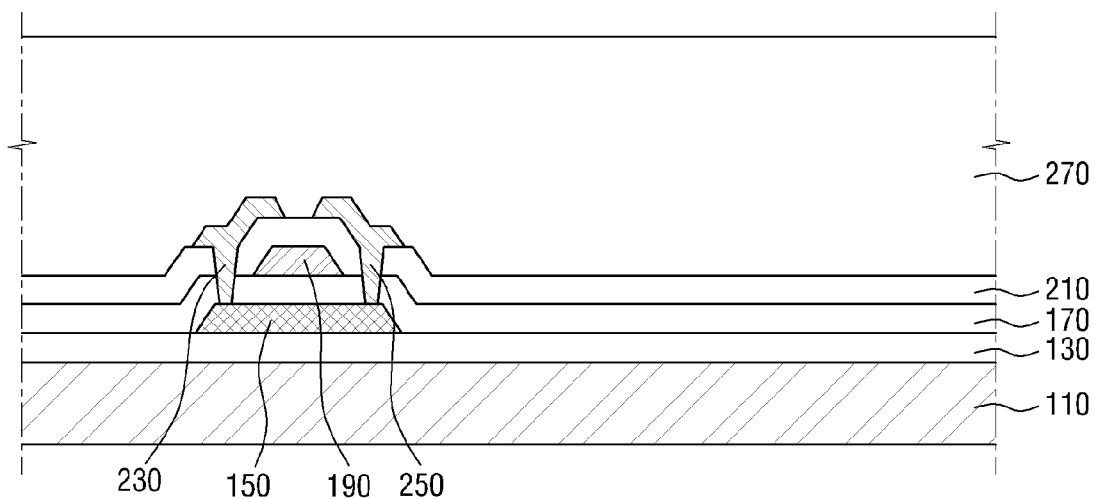
FIGS. 3 through 15 are cross-sectional views illustrating operations in a method of manufacturing the display device of FIG. 1.

Referring to FIG. 3, a substrate 110 on which a buffer layer 130, a semiconductor pattern 150, a gate insulating layer 170, a gate electrode 190, an interlayer insulating film 210, a source electrode 230, a drain electrode 250, and a planarization layer 270 are sequentially stacked is provided.

More specifically, the buffer layer 130 is formed on the whole surface of the substrate 110. A semiconductor layer is formed on the buffer layer 130 and then patterned to form the semiconductor pattern 150. The gate insulating layer 170 is formed on the whole surface of the substrate 110 having the semiconductor pattern 150. A conductive layer is formed on the gate insulating layer 170 and then patterned to form the gate electrode 190. Next, the interlayer insulating film 210 is formed on the whole surface of the substrate 110 having the gate electrode 190. A conductive layer is formed on the interlayer insulating film 210 and then patterned to form the source electrode 230 and the drain electrode 250. The planarization layer 270 is formed on the whole surface of the substrate 110 having the previously formed and patterned elements.

Figure 4:
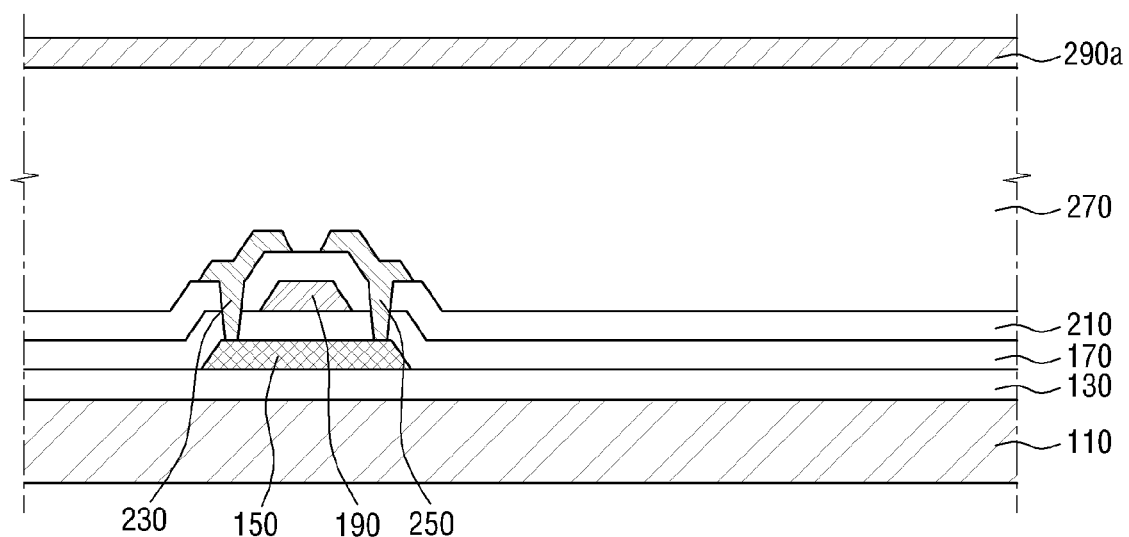

Referring to FIG. 4, a first amorphous metal oxide layer 290a is deposited on the planarization layer 270. The first amorphous metal oxide layer 290a may be formed of amorphous tin oxide, indium oxide, zinc oxide, titanium oxide, antimony oxide, indium-tin oxide, zinc-tin oxide, antimony-tin oxide, indium-zinc oxide, etc.

Since deposition process energy accumulated in the process of depositing the first amorphous metal oxide layer 290a is not large enough to crystallize amorphous metal oxide, the amorphous metal oxide may not be crystallized.

Figure 5:
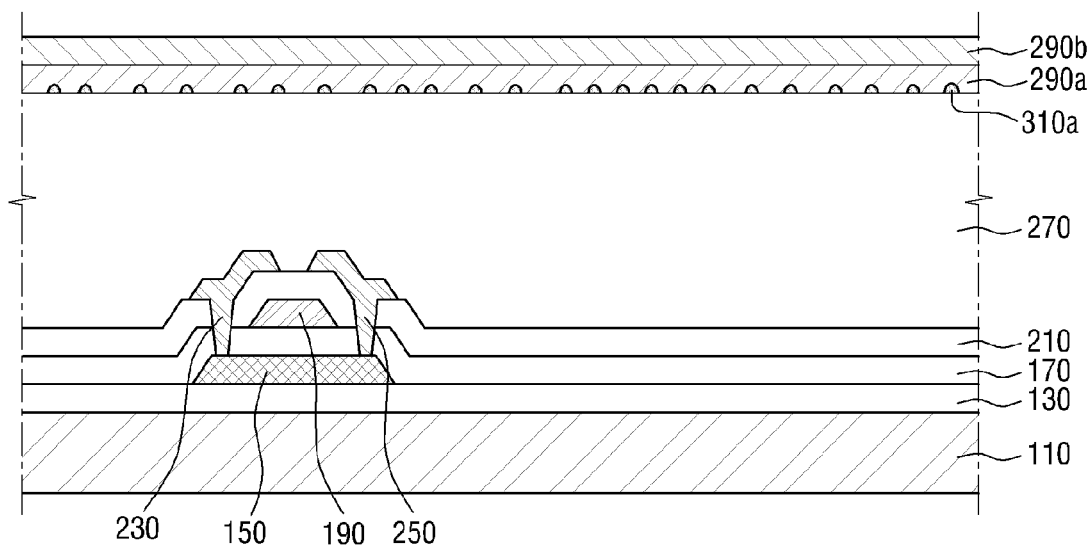

Referring to FIG. 5, a second amorphous metal oxide layer 290b is deposited on the first amorphous metal oxide layer 290a. Here, the first amorphous metal oxide layer 290a and the second amorphous metal oxide layer 290b may be deposited discontinuously. The second amorphous metal oxide layer 290b may be formed of amorphous tin oxide, indium oxide, zinc oxide, titanium oxide, antimony oxide, indium-tin oxide, zinc-tin oxide, antimony-tin oxide, indium-zinc oxide, etc. The second amorphous metal oxide layer 290b may be formed of the same material as or a different material from the first amorphous metal oxide layer 290a.

In the process of depositing the second amorphous metal oxide layer 290b, a portion of the first amorphous metal oxide layer 290a which is adjacent to the planarization layer 270 may be crystallized by the sufficiently accumulated deposition process energy. The crystallized portion of the amorphous metal oxide may become scattering patterns 310a. The scattering patterns 310a formed in the operation of FIG. 5 may have a small particle size because they have not yet fully grown.

Figure 6:
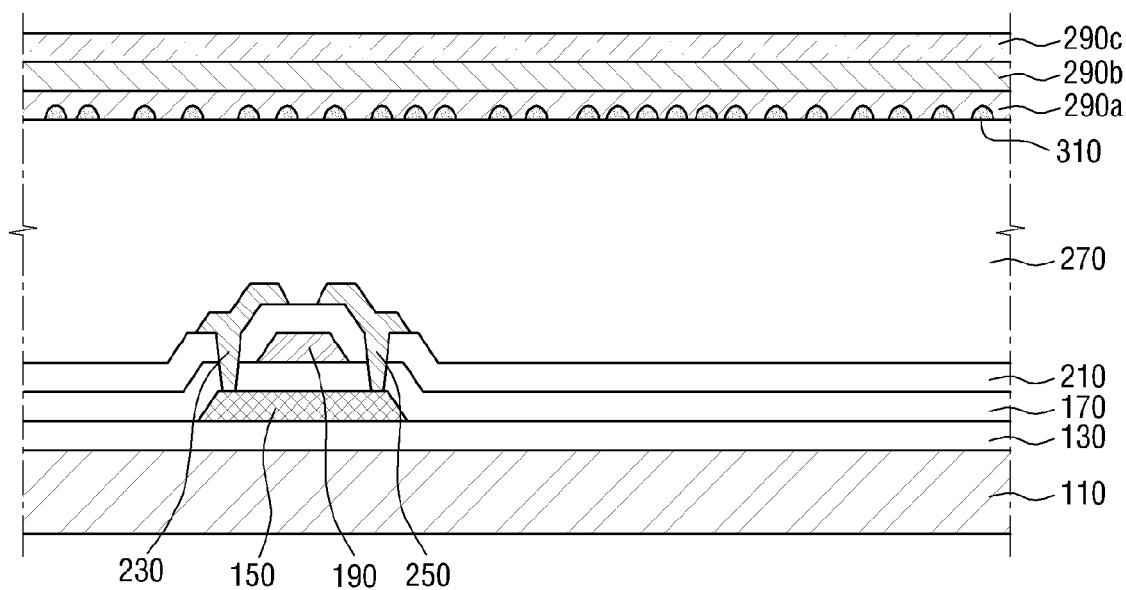

Referring to FIG. 6, a third amorphous metal oxide layer 290c is deposited on the second amorphous metal oxide layer 290b. Here, the second amorphous metal oxide layer 290b and the third amorphous metal oxide layer 290c may be deposited discontinuously. The third amorphous metal oxide layer 290c may be formed of amorphous tin oxide, indium oxide, zinc oxide, titanium oxide, antimony oxide, indium-tin oxide, zinc-tin oxide, antimony-tin oxide, indium-zinc oxide, etc. The third amorphous metal oxide layer 290c may be formed of the same material as at least one of the first amorphous metal oxide layer 290a and the second amorphous metal oxide layer 290b or may be formed of a different material from the first amorphous metal oxide layer 290a and the second amorphous metal oxide layer 290b. The amorphous metal oxide crystallized in the process of depositing the third amorphous metal oxide layer 290c, that is, the scattering patterns 310 may be grown bigger by the more accumulated deposition process energy. That is, the particle size of the scattering patterns 310 may increase.

The above process of depositing the amorphous metal oxide may be performed at room temperature or at a relatively low temperature of 100° C. or below. In addition, the scattering patterns 310 may be formed during the process of depositing the amorphous metal oxide. That is, the process of depositing the amorphous metal oxide may be performed at the same time as the process of forming the scattering patterns 310. Since the scattering patterns 310 are formed at room temperature, the equipment for a high-temperature process may be unnecessary. Further, since the amorphous metal oxide having high chemical resistance is used, the process can be easily performed in a state where the amorphous metal oxide is exposed.

The process of forming the scattering patterns 310 may include easily adjusting the particle size of the scattering patterns 310 by adjusting at least one of a thickness to which the amorphous metal oxide is deposited and the number of times that the amorphous metal oxide is deposited. That is, when the amorphous metal oxide is deposited to a greater thickness, the deposition process energy delivered to the amorphous metal oxide may increase, thereby increasing the particle size of the scattering patterns 310 that are formed. In addition, when the amorphous metal oxide is deposited continuously, the deposition process energy may be delivered incessantly compared with when it is deposited discontinuously. Therefore, the particle size of the scattering patterns 310 that are formed may increase.

In addition, the process of forming the scattering patterns 310 may include discharging an auxiliary gas onto the substrate 110 at the same time as depositing the amorphous metal oxide. Here, the auxiliary gas may be at least one of hydrogen and water.

Furthermore, the process of forming the scattering patterns 310 may include easily adjusting the particle size of the scattering patterns 310 by adjusting a rate of discharge of the auxiliary gas. The auxiliary gas tends to permeate into the amorphous metal oxide and maintain amorphous properties of the amorphous metal oxide. Therefore, if the rate of discharge of the auxiliary gas is increased during the process of depositing the amorphous metal oxide, the particle size of the scattering patterns 310 that are formed can be reduced because the amorphous properties of the amorphous metal oxide tend to be maintained.

Accordingly, when the first amorphous metal oxide layer 290a is deposited, the crystallization properties of the first amorphous metal oxide layer 290a may be increased by not discharging the auxiliary gas or reducing the rate of discharge of the auxiliary gas. On the other hand, when the second amorphous metal oxide layer 290b and the third amorphous metal oxide layer 290c are deposited, the crystallization of the second amorphous metal oxide layer 290b and the third amorphous metal oxide layer 290c may be prevented by increasing the rate of discharge of the auxiliary gas. Here, the second amorphous metal oxide layer 290b and the third amorphous metal oxide layer 290c may be formed continuously.

Figure 7:
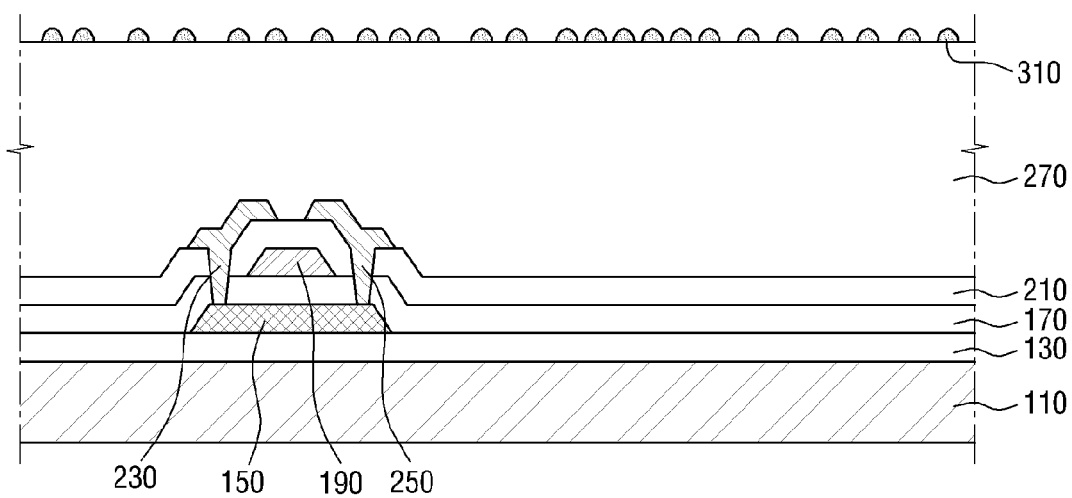

Referring to FIG. 7, after the formation of the scattering patterns 310 having a desired particle size, an uncrystallized portion of the amorphous metal oxide is removed. Since there are many etchants that can etch only the uncrystallized portion of the amorphous metal oxide, only the uncrystallized portion of the amorphous metal oxide can be removed. That is, desired scattering patterns 310 can be easily obtained using an etchant that can etch only the uncrystallized portion of the amorphous metal oxide.

Figure 8:
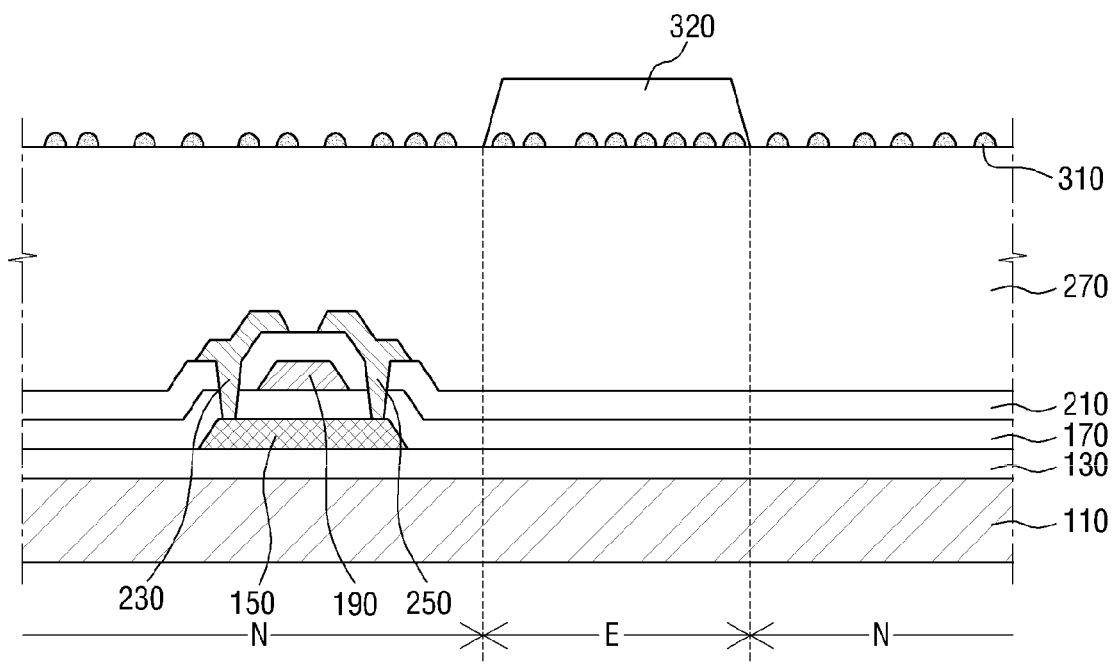

Referring to FIG. 8, a photoresist 320 is formed on an emission region E of the substrate 110. That is, scattering patterns 310 located on the emission region E of the substrate 110 may be covered with the photoresist 320.

Figure 9:
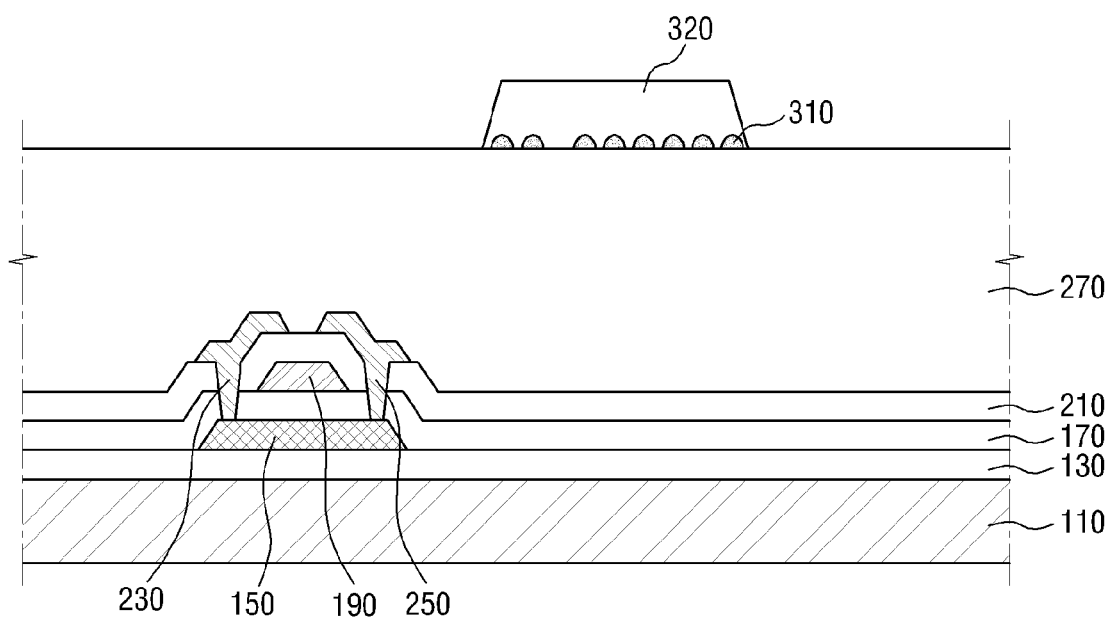

Referring to FIG. 9, the scattering patterns 310 are patterned using the photoresist 320 as an etch mask. Specifically, scattering patterns 310 excluding the scattering patterns 310 covered with the photoresist 320 may be removed using an etchant. That is, the scattering patterns 310 may be patterned such that the scattering patterns 310 existing only on the emission region E remain.

Figure 10:
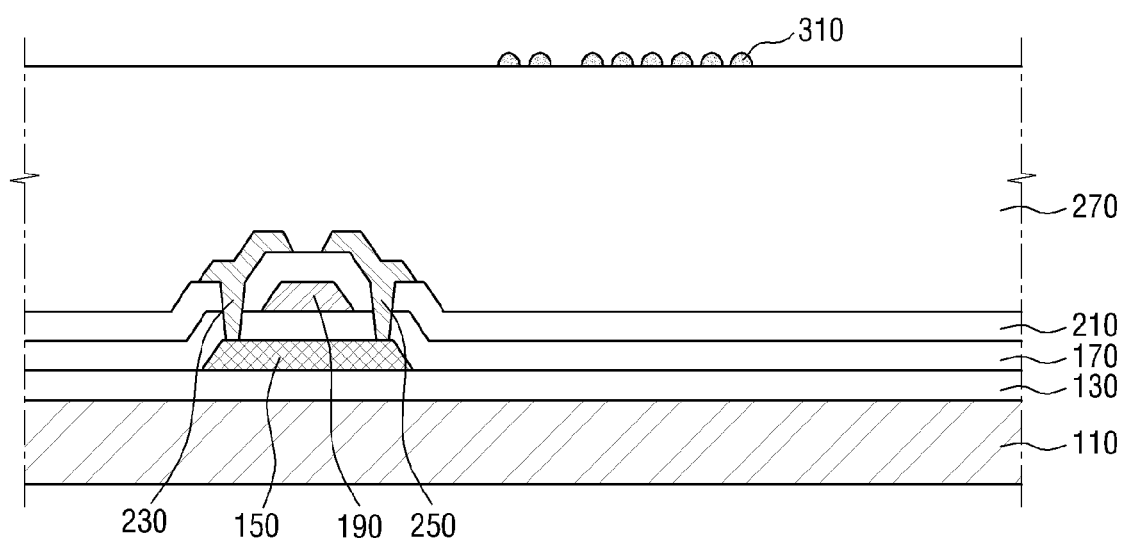

Referring to FIG. 10, the photoresist 320 is removed. That is, the photoresist 320 that covers the scattering patterns 310 located on the emission region E of the substrate 110 is removed to expose the scattering patterns 310.

Figure 11:
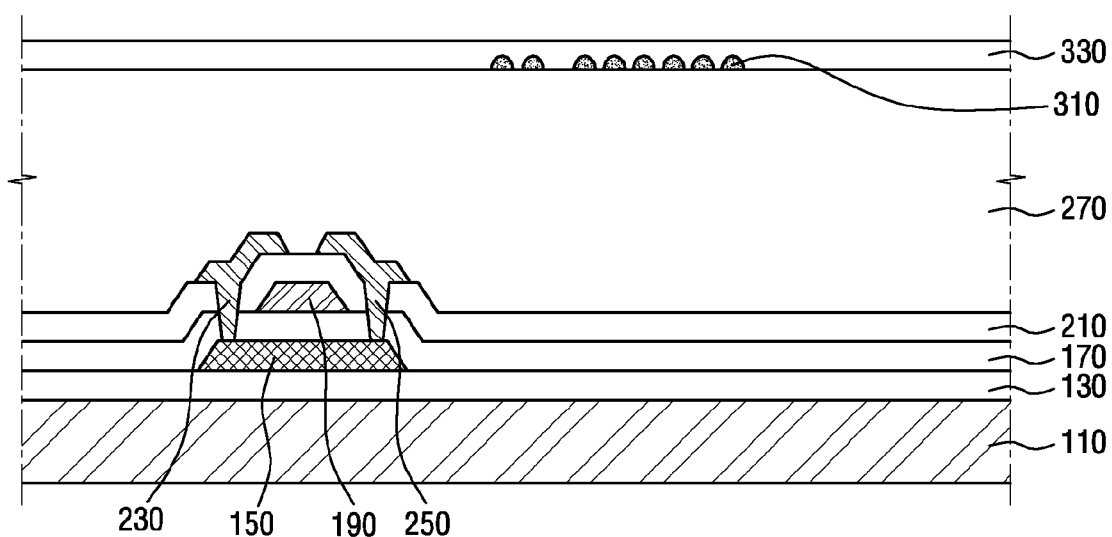

Referring to FIG. 11, a high refractive layer 330 is formed on the scattering patterns 310. The high refractive layer 330 may be formed by a general deposition process. The high refractive layer 330 may completely cover the scattering patterns 310 and planarization layer 270. The high refractive layer 330 may be located on both the emission region E and a non-emission region N of the substrate 110.

Figure 12:
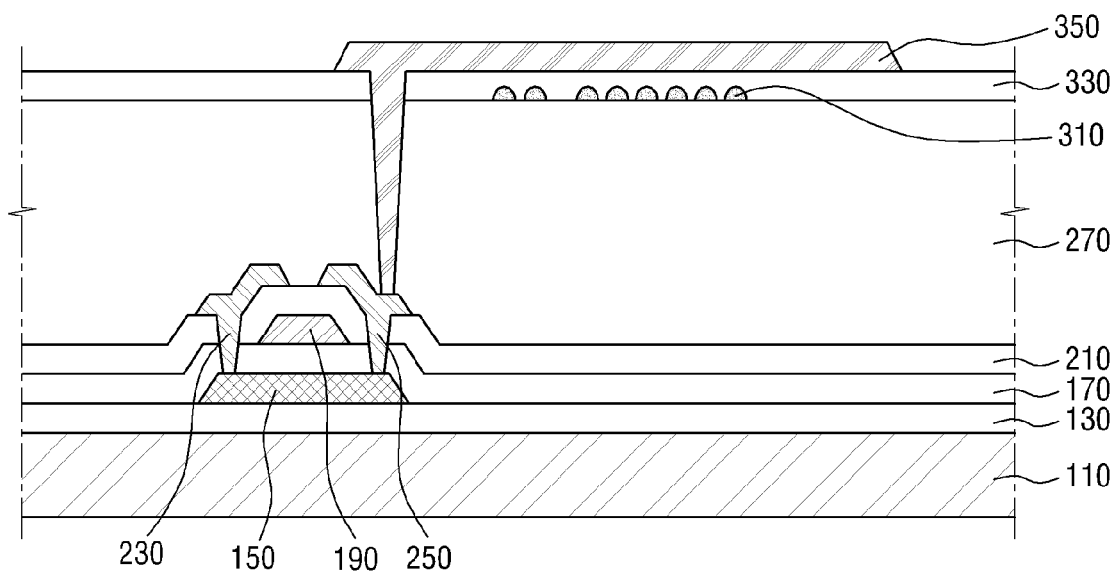

Referring to FIG. 12, a first electrode 350 is formed on the high refractive layer 330. The first electrode 350 may overlap the scattering patterns 310. The first electrode 350 may be located on the emission region E of the substrate 110 and a portion of the non-emission region N. The first electrode 350 may be electrically connected to the drain electrode 250 by a hole that penetrates through the high refractive layer 330 and the planarization layer 270.

Figure 13:
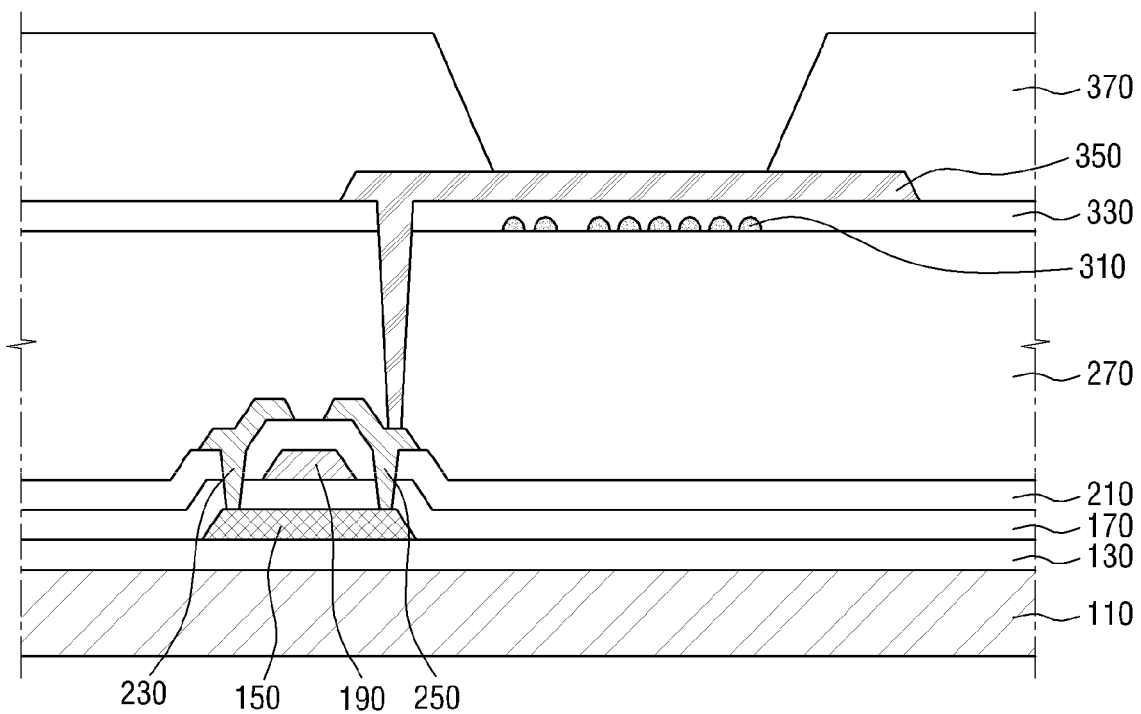

Referring to FIG. 13, a pixel defining layer 370 is formed on the high refractive layer 330 and the first electrode 350. The pixel defining layer 370 may be formed on the non-emission region N of the substrate 110. In addition, the pixel defining layer 370 may expose the emission region E of the substrate 110. The pixel defining layer 370 may be formed or patterned to expose at least part of the first electrode 350.

Figure 14:
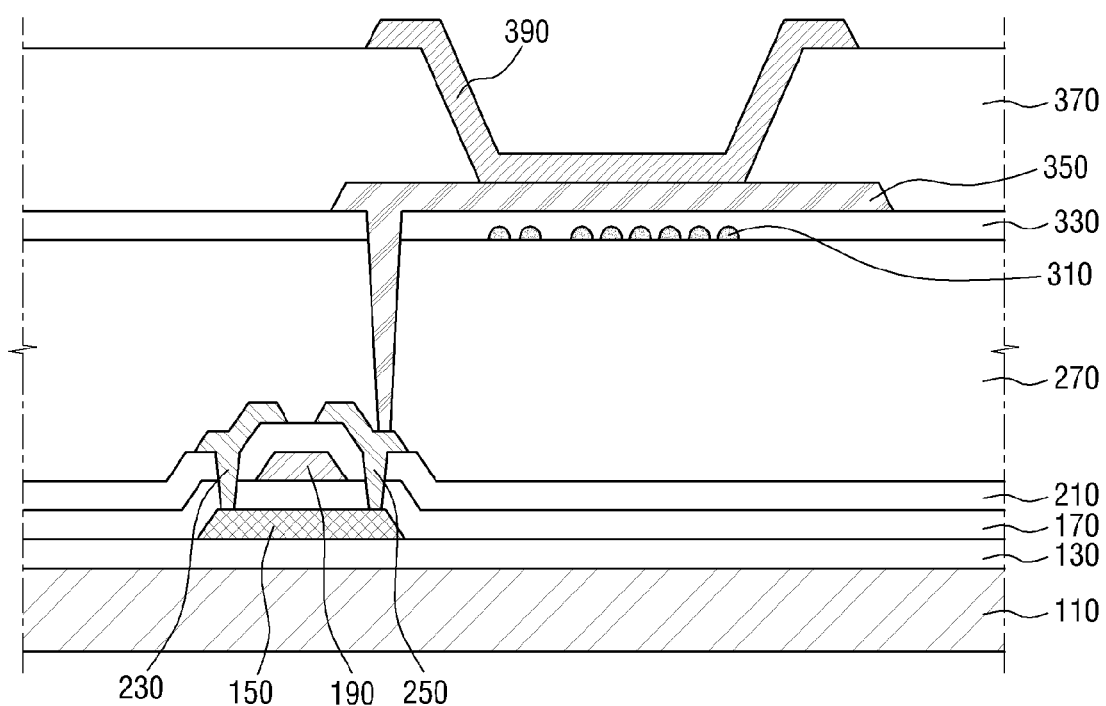

Referring to FIG. 14, an organic light-emitting layer 390 is formed on the first electrode 350. The organic light-emitting layer 390 may be formed to contact the first electrode 350 and at least side surfaces of the pixel defining layer 370. The organic light-emitting layer 390 may be formed to overlap a portion of an upper surface of the pixel defining layer 370.

Figure 15:
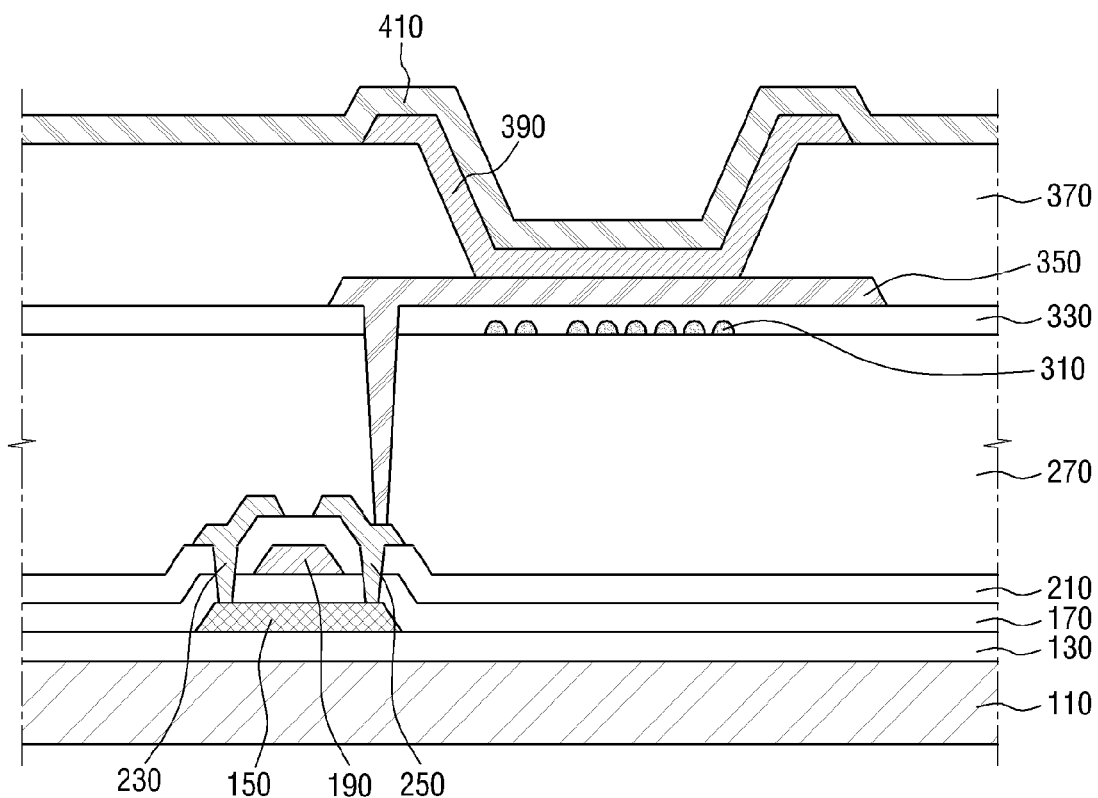

Referring to FIG. 15, a second electrode 410 is formed on the organic light-emitting layer 390 and eposed portions of the pixel defining layer 370. As a common electrode, the second electrode 410 may be formed over the whole surface of the substrate 110.

In the method of manufacturing the display device according to the current embodiment, a display device having a high-quality non-resonance structure can be easily manufactured. In addition, a display device having improved lateral visibility can be easily manufactured. Further, since a thin cathode is not required in a top emission display device, it is possible to prevent the formation of a non-uniform cathode and an IR drop. Accordingly, it is easy to apply a scattering structure for a display device having a non-resonance structure.

Figure 16:
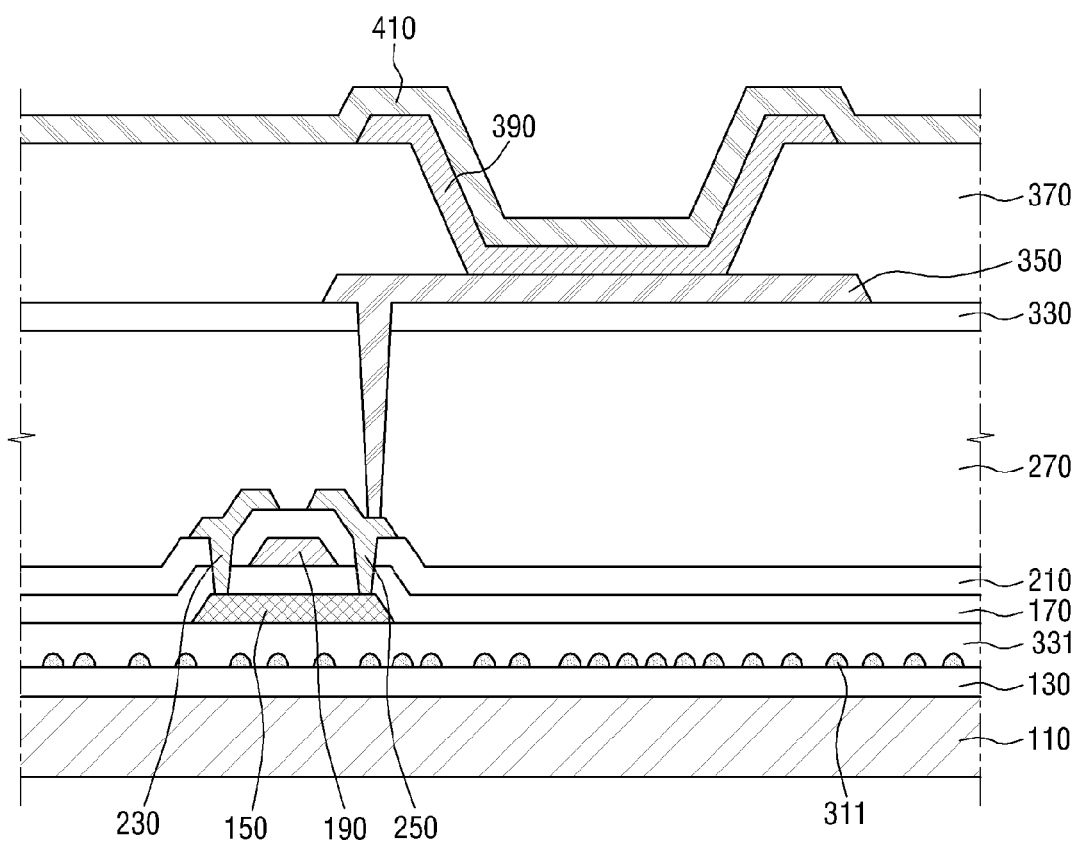
FIG. 16 is a cross-sectional view of a display device according to another embodiment of the present invention.

FIG. 16 is a cross-sectional view of a display device according to another embodiment of the present invention. For simplicity, elements substantially identical to those of FIG. 1 are indicated by like reference numerals, and thus a redundant description thereof will be omitted.

Referring to FIG. 16, a plurality of scattering patterns 311 may be interposed between a TFT and a substrate 110. In an exemplary embodiment, the scattering patterns 311 may directly contact a buffer layer 130. In addition, the scattering patterns 311 may be formed not only on an emission region E but also on a non-emission region N. Also, a high refractive layer 331 may be interposed between the scattering patterns 311 and the TFT. In an exemplary embodiment, the high refractive layer 331 may directly contact all of the buffer layer 130, the scattering patterns 311, a semiconductor pattern 150, and a gate insulating layer 170.

The display device according to the current embodiment may be a bottom emission display device. In the bottom emission display device displays, light is emitted toward the substrate 110 to realize an image. Even if the scattering patterns 311 are formed adjacent to the substrate 110, a sufficient scattering effect can be obtained.

Figure 17:
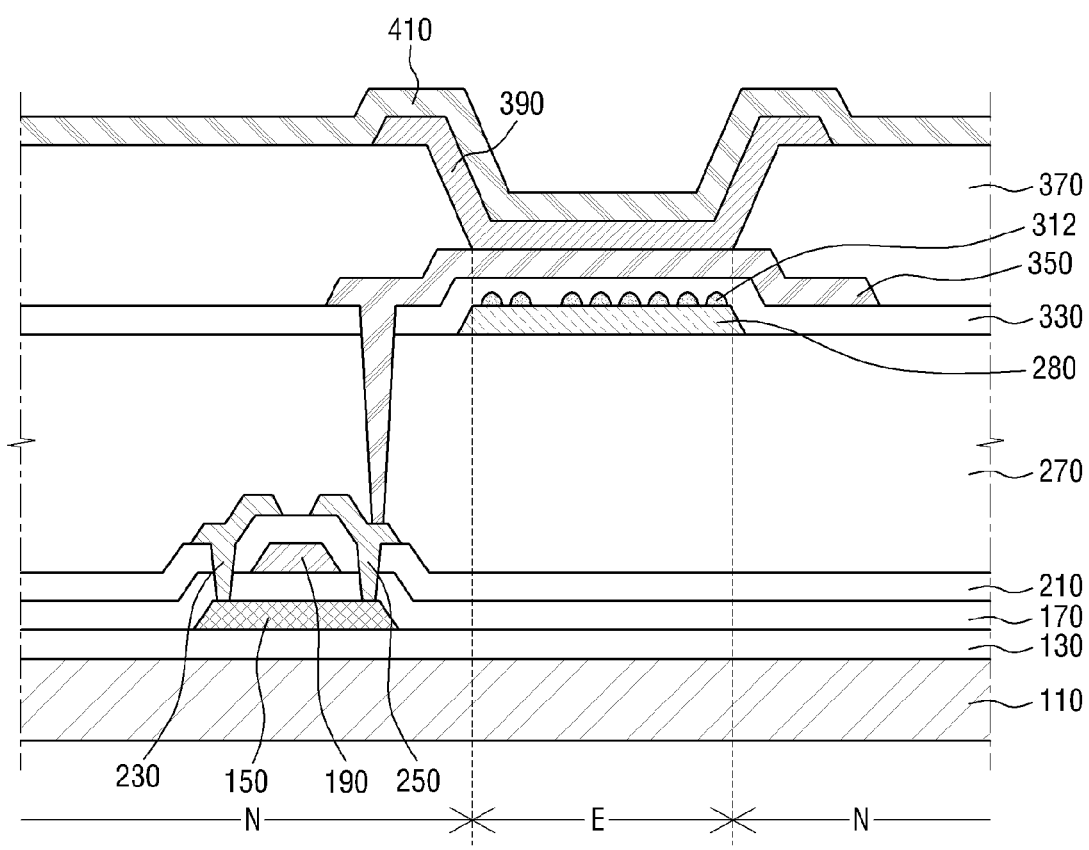
FIG. 17 is a cross-sectional view of a display device according to another embodiment of the present invention.

FIG. 17 is a cross-sectional view of a display device according to another embodiment of the present invention. For simplicity, elements substantially identical to those of FIG. 1 are indicated by like reference numerals, and thus a redundant description thereof will be omitted.

Referring to FIG. 17, the display device may further include a reflective layer 280 which is interposed between a substrate 110 and a plurality of scattering patterns 312. In an exemplary embodiment, the reflective layer 280 may be interposed between the scattering patterns 312 and a planarization layer 270. In addition, the scattering patterns 312 may directly contact the reflective layer 280. The reflective layer 280 may be formed of a metal material. However, the present invention is not limited thereto, and the reflective layer 280 may include various materials having reflexibility.

The display device according to the current embodiment may be a top emission display device. In the top emission display device, light emitted from an organic light-emitting layer 390 may be reflected at the surface of the reflective layer 280 to proceed toward a second electrode 410. Here, since the light exits in the display device after being scattered by the scattering patterns 312 existing on the reflective layer 280, a display device having a non-resonance structure can be realized.

Embodiments of the present invention provide at least one of the following advantages.

That is, since scattering patterns formed of crystallized metal oxide scatter light, a non-resonance structure of a display device can be easily realized.

In addition, the amount of light emitted to sides of the display device increases, thereby improving lateral visibility of the display device.

Also, since the scattering patterns are formed at room temperature, the equipment for a high-temperature process may be unnecessary.

Further, it is easy to adjust a particle size of the scattering patterns.

However, the effects of the present invention are not restricted to the one set forth herein. The above and other effects of the present invention will become more apparent to one of daily skill in the art to which the present invention pertains by referencing the claims.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A display device comprising:
   a substrate;
   a plurality of scattering patterns which are located on the substrate and comprise crystallized metal oxide;
   a first electrode disposed above the scattering patterns;
   an insulating layer interposed between the scattering patterns and the first electrode;
   an organic light-emitting layer disposed on the first electrode; and
   a second electrode disposed on the organic light-emitting layer.

2. The display device of claim 1, the scattering patterns comprising at least one of tin oxide, indium oxide, zinc oxide, titanium oxide, antimony oxide, indium-tin oxide, zinc-tin oxide, antimony-tin oxide, and indium-zinc oxide.

3. The display device of claim 1, the scattering patterns being formed of the same material as the first electrode or the second electrode.

4. A display device comprising:
   a substrate;
   a plurality of scattering patterns which are located on the substrate and comprise crystallized metal oxide;
   a first electrode disposed above the scattering patterns;
   an organic light-emitting layer disposed on the first electrode; and
   a second electrode disposed on the organic light-emitting layer, wherein
   the crystallinity of the scattering patterns increases toward the substrate.

5. The display device of claim 1, the scattering patterns being arranged randomly, each of the scattering patterns having a convex shape.

6. The display device of claim 1, a refractive index of the insulating layer being greater than a refractive index of the scattering patterns.

7. The display device of claim 1, further comprising a reflective layer interposed between the substrate and the scattering patterns, the scattering patterns directly contacting the reflective layer.

8. A method of manufacturing a display device, the method comprising:
   forming a substrate;
   forming a plurality of scattering patterns, which comprise crystallized metal oxide, in an emission region of the substrate;
   forming an insulating layer on the scattering patterns; and
   forming a first electrode on the insulating layer.

9. The method of claim 8, the forming of the scattering patterns comprising:
   depositing a first amorphous metal oxide on the substrate; and
   crystallizing portions of the deposited first amorphous metal oxide.

10. The method of claim 9, the crystallizing of the portions of the deposited amorphous metal oxide being performed at room temperature.

11. The method of claim 8, the forming of the scattering patterns comprising depositing a second amorphous metal oxide at the same time as crystallizing the portions of the deposited first amorphous metal oxide.

12. The method of claim 11, further comprising removing uncrystallized portions of the first and second amorphous metal oxides after the forming of the scattering patterns.

13. The method of claim 12, further comprising forming an insulating layer, having a greater refractive index than a refractive index of the scattering patterns, on the scattering patterns after the removal of the uncrystallized portions of the first and second amorphous metal oxides.

14. The method of claim 11, the amorphous metal oxide being amorphous indium-tin oxide.

15. The method of claim 11, the forming of the scattering patterns comprising adjusting a particle size of the scattering patterns by adjusting at least one of a thickness to which the first or second amorphous metal oxide is deposited and a number of layers of amorphous metal oxide being deposited.

16. The method of claim 11, the forming of the scattering patterns comprising discharging at least one of hydrogen and water onto the substrate at the same time as depositing the first or second amorphous metal oxide.

17. The method of claim 16, the forming of the scattering patterns comprising adjusting a particle size of the scattering patterns by adjusting a rate of discharge of at least one of the hydrogen and the water.

18. The method of claim 16, the forming of the scattering patterns comprising:
   depositing the first amorphous metal oxide while discharging at least one of the hydrogen and the water at a first rate; and
   depositing the second amorphous metal oxide while discharging at least one of the hydrogen and the water at a second rate greater than the first rate.

19. A method of manufacturing a display device, the method comprising:
   depositing amorphous metal oxide on a substrate at room temperature while crystallizing portions of the amorphous metal oxide located adjacent to the substrate; and
   sequentially forming an insulating layer, a first electrode, an organic light-emitting layer, and a second electrode on the crystallized portions of the amorphous metal oxide.

20. The method of claim 19, further comprising, after the crystallizing of the portions of the amorphous metal oxide:
   removing uncrystallized portions of the amorphous metal oxide; and
   forming an insulating layer, which has a refractive index greater than a refractive index of the crystallized portion of the amorphous metal oxide, on the crystallized portion of the amorphous metal oxide.

* * * * *